United States Patent
Ushiro et al.

(10) Patent No.: US 8,575,636 B2
(45) Date of Patent: Nov. 5, 2013

(54) ADHESION STRUCTURE OF LIGHT-TRANSMITTING MEMBER AND LIGHT-BLOCKING MEMBERS, METHOD OF MANUFACTURING OPTICAL MODULE INCLUDING LIGHT-TRANSMITTING MEMBER AND LIGHT-BLOCKING MEMBERS, AND OPTICAL MODULE

(75) Inventors: Yuki Ushiro, Ayabe (JP); Takamasa Kameda, Fukuchiyama (JP); Kazunari Komai, Kameoka (JP); Tsuyoshi Miyata, Ayabe (JP); Motoharu Okuno, Ayabe (JP); Makoto Kasuya, Ayabe (JP)

(73) Assignee: OMRON Corporation, Kyoto (JP)

( * ) Notice: Subject to any disclaimer, the term of this patent is extended or adjusted under 35 U.S.C. 154(b) by 37 days.

(21) Appl. No.: 13/123,273

(22) PCT Filed: Oct. 14, 2009

(86) PCT No.: PCT/JP2009/067757
§ 371 (c)(1),
(2), (4) Date: Apr. 8, 2011

(87) PCT Pub. No.: WO2010/044408
PCT Pub. Date: Apr. 22, 2010

(65) Prior Publication Data
US 2011/0193125 A1    Aug. 11, 2011

(30) Foreign Application Priority Data
Oct. 16, 2008  (JP) .................. 2008-267736

(51) Int. Cl.
*H01L 33/50* (2010.01)
(52) U.S. Cl.
USPC ........................................... 257/98
(58) Field of Classification Search
USPC ................... 257/98–100, 432–433
See application file for complete search history.

(56) References Cited

U.S. PATENT DOCUMENTS 8,049,237 B2 * 11/2011 Yamada et al. ............... 257/98
2007/0091293 A1    4/2007 Okuno et al.
(Continued)

FOREIGN PATENT DOCUMENTS

JP     8-184820 A    7/1996
JP    10-36777 A     2/1998
(Continued)

OTHER PUBLICATIONS

International Search Report w/translation from PCT/JP2009/067757 dated Jan. 26, 2010 (7 pages).
(Continued)

*Primary Examiner* — Nathan Ha
(74) *Attorney, Agent, or Firm* — Osha Liang LLP (57) ABSTRACT

A first light-blocking member and a second light-blocking member are adhered to each other by forming a light-transmitting layer having a light-transmitting composition serving as a base material and a light-transmitting filler different in index of refraction from this light-transmitting composition on a front surface of the first light-blocking member. A liquid light curing adhesive is applied to a front surface of the light-transmitting layer. The second light-blocking member is arranged on the front surface of the light-transmitting layer to which the liquid light curing adhesive has been applied. The liquid light curing adhesive is cured by irradiating the light-transmitting layer with light having a prescribed wavelength laterally from a side of the light-transmitting layer so as to adhere the light-transmitting layer and the second light-blocking member to each other. By adhering light-blocking members to each other, an adhesion operation may easily and quickly be performed with sufficient adhesion strength.

10 Claims, 7 Drawing Sheets

(56) References Cited

U.S. PATENT DOCUMENTS

| | | |
|---|---|---|
| 2008/0029886 A1 | 2/2008 | Cotte et al. |
| 2009/0027592 A1 | 1/2009 | Motomatsu |
| 2009/0039368 A1* | 2/2009 | Omae et al. .................. 257/98 |
| 2009/0095967 A1* | 4/2009 | Masui et al. ................... 257/98 |
| 2009/0166657 A1* | 7/2009 | Yamada et al. ................ 257/98 |
| 2009/0261374 A1* | 10/2009 | Hayashi ......................... 257/99 |

FOREIGN PATENT DOCUMENTS

| | | |
|---|---|---|
| JP | 10-143931 A | 5/1998 |
| JP | 11-53778 A | 2/1999 |
| JP | 11-241055 A | 9/1999 |
| JP | 11-283285 A | 10/1999 |
| JP | 2000-336321 A | 12/2000 |
| JP | 2003-033924 A | 2/2003 |
| JP | 2005-187663 A | 7/2005 |
| JP | 2007-60112 A | 3/2007 |
| JP | 2007-142371 A | 6/2007 |
| JP | 2007-287801 A | 11/2007 |
| JP | 2008-42904 A | 2/2008 |
| JP | 2009-31432 A | 2/2009 |
| WO | 2009/037976 A1 | 3/2009 |
| WO | 2009/087882 A1 | 7/2009 |
| WO | 2009/090842 A1 | 7/2009 |

OTHER PUBLICATIONS

Japanese Office Action w/English translation mailed on Sep. 7, 2010, for Patent Application No. 2008-267736 (5 pages).
Patent Abstracts of Japan Publication No. 10-036777 dated Feb. 10, 1998 (1 page).
Patent Abstracts of Japan Publication No. 11-283285 dated Oct. 15, 1999 (1 page).
Patent Abstracts of Japan Publication No. 10-143931 dated May 29, 1998 (1 page).
Patent Abstracts of Japan Publication No. 2007-142371 dated Jun. 7, 2007 (1 page).
Patent Abstracts of Japan Publication No. 2008-042904 dated Feb. 21, 2008 (1 page).
Patent Abstracts of Japan Publication No. 2007-287801 dated Nov. 1, 2007 (1 page).
Patent Abstracts of Japan Publication No. 2009-031432 dated Feb. 12, 2009 (1 page).
Patent Abstracts of Japan Publication No. 11-241055 dated Sep. 7, 1999 (1 page).
Patent Abstracts of Japan Publication No. 2003-033924 dated Feb. 4, 2003 (1 page).
Patent Abstracts of Japan Publication No. 2007-060112 date Mar. 8, 2007 (1 page).
Patent Abstracts of Japan Publication No. 11-053778 dated Feb. 26, 1999 (1 page).
Patent Abstracts of Japan Publication No. 2000-336321 dated Dec. 5, 2000 (1 page).
Extended European Search Report issued in corresponding European Application No. 09820586.7 dated Jun. 6, 2012 (7 pages).
espacenet, Patent Abstracts of Japan, Publication No. 2005-187663, Published on Jul. 14, 2005, 1 page.
espacenet, Patent Abstracts of Japan, Publication No. 8-184820, Published on Jul. 16, 1996, 1 page.

* cited by examiner

ADHESION STRUCTURE OF LIGHT-TRANSMITTING MEMBER AND LIGHT-BLOCKING MEMBERS, METHOD OF MANUFACTURING OPTICAL MODULE INCLUDING LIGHT-TRANSMITTING MEMBER AND LIGHT-BLOCKING MEMBERS, AND OPTICAL MODULE

BACKGROUND OF THE INVENTION

1. Technical Field

One or more embodiments of the present invention relate to an adhesion method and an adhesion structure using an adhesive containing a light curing resin composition, as well as to a method of manufacturing an optical module and an optical module for which the adhesive containing the light curing resin composition is suitably made use of.

2. Background Art

An adhesive containing a light curing resin composition (hereinafter also referred to as a "light curing adhesive") has widely been made use of in various industrial fields, and it has been known as an adhesive suitable for application in a small amount, that is cured in a short period of time by irradiation with ultraviolet light or visible light. Therefore, it can be said that the light curing adhesive is superior to a thermosetting adhesive requiring heat treatment or an anaerobic adhesive which starts to cure immediately after contact with air, in terms of an operation time required for adhesion or handling in adhesion.

If adhesion objects are less-light-transmitting members through which light for curing a light curing adhesive is less likely to pass (hereinafter simply referred to as a "light-blocking member"), however, a very complicated operation is required in order to obtain sufficient adhesion strength in adhering these members by using a light curing adhesive. Normally, in a case where at least one of adhesion objects is a light-transmitting member through which light for curing a light curing adhesive readily passes (hereinafter simply referred to as a "light-transmitting member"), the light curing adhesive can very readily be cured by arranging the adhesion objects in a manner opposed to each other such that a gap between adhesion surfaces of the adhesion objects is filled with the light curing adhesive and irradiating the entire surface of the adhesive with light through the light-transmitting member from a direction of normal of the adhesion surface in such a state. In a case where the adhesion objects are both light-blocking members as described above, however, the entire surface of the adhesive cannot be irradiated with light after the adhesion objects are arranged in a manner opposed to each other.

Therefore, as an adhesion method for adhering light-blocking members to each other by using a light curing adhesive, a light curing adhesive generally called a delayed curing adhesive, that has been improved so that curing reaction does not progress immediately after irradiation with light but curing progresses gradually, is generally used. Specifically, before the adhesion surfaces of the adhesion objects are arranged in a manner opposed to each other, the delayed curing adhesive before application to the adhesion surface or the delayed curing adhesive after application to the adhesion surface is irradiated with light and then the adhesion objects are arranged in a manner opposed to each other after irradiation with light. Then, the adhesion objects are bonded to each other in such a manner that the gap between the adhesion surfaces of the adhesion objects is filled with the delayed curing adhesive that has already been irradiated with light and this state is held for a prescribed period of time to wait for curing of the delayed curing adhesive. Adhesion between the adhesion objects can thus be achieved.

When the adhesion objects are adhered to each other by using such an adhesion method, however, an operation for bonding the adhesion objects to each other should be performed before curing of the delayed curing adhesive without fail, and if the bonding operation takes time, curing of the delayed curing adhesive progresses before the bonding operation and sufficient adhesion strength cannot be obtained after bonding. Therefore, a time for operation or the like is significantly restricted and an adhesion operation is not necessarily easy.

Japanese Patent Laying-Open No. 11-241055 (Patent Document 1) proposes improvement in controllability of a rate of curing of a delayed curing adhesive by controlling a quantity of light irradiation for irradiating the delayed curing adhesive. In addition, Japanese Patent Laying-Open No. 2003-33924 (Patent Document 2) proposes improvement in controllability of a rate of curing of a delayed curing adhesive by controlling a temperature of the delayed curing adhesive.

A specific case in which the adhesion objects described above are adhered to each other by using a light curing adhesive is, for example, manufacturing of an optical module used as an emitter or a receiver of a photoelectric sensor. Surface mount packaging has recently been developed in the optical module, and adhesion between adhesion objects in particular using a light curing adhesive described above is required in the optical module subjected to this surface mount packaging. In general, in an optical module, such a structure that an optical semiconductor device such as an LED (Light-Emitting Diode) chip or a PD (Photo Diode) chip is mounted on an interposer serving as a base member, a light-transmitting member formed in a layered manner seals a front surface of the interposer on which this optical semiconductor device has been mounted, and a reflector serving as a light guide path forming member is disposed on the front surface of the light-transmitting member has been adopted. Here, the interposer and the reflector are both light-blocking members. Though the light-transmitting member formed in a layered manner is present therebetween, it can be said that the step of adhering the interposer and the reflector to each other substantially corresponds to the step of adhering light-blocking members to each other.

PATENT DOCUMENTS

Patent Document 1: Japanese Patent Laying-Open No. 11-241055
Patent Document 2: Japanese Patent Laying-Open No. 2003-33924

SUMMARY OF THE INVENTION

If the adhesion method making use of a delayed curing adhesive as disclosed in Japanese Patent Laying-Open No. 11-241055 above and Japanese Patent Laying-Open No. 2003-33924 above is adopted, however, an amount of irradiation with light for irradiating the delayed curing adhesive or a temperature of the delayed curing adhesive should be controlled separately, although controllability of the rate of curing of the delayed curing adhesive is improved. Therefore, adjustment involved with control should be made, and if such adjustment is insufficient, operability significantly lowers.

Therefore, one or more embodiments of the present invention may provide an adhesion method allowing an easy and quick adhesion operation while ensuring sufficient adhesion strength in adhering light-blocking members to each other by using an adhesive containing a light curing resin composition, and an adhesion structure.

In addition, one or more embodiments of the present invention may provide a method of manufacturing an optical module that allows easy and quick manufacturing and allows manufacturing with sufficient adhesion strength, and an optical module.

An adhesion method based on one or more embodiments of the present invention is an adhesion method for adhering by using an adhesive containing a light curing resin composition cured by irradiation with light having a prescribed wavelength, a first light-blocking member allowing substantially no passage of light having the prescribed wavelength and a second light-blocking member allowing substantially no passage of light having the prescribed wavelength to each other, including the steps of: providing a light-transmitting member allowing passage of light having the prescribed wavelength on a front surface of the first light-blocking member; applying the adhesive to at least any of a front surface of the light-transmitting member and a back surface of the second light-blocking member; stacking the second light-blocking member on the front surface of the light-transmitting member in such a manner that the front surface of the light-transmitting member and the back surface of the second light-blocking member are opposed to each other with the applied adhesive being interposed; and adhering the light-transmitting member and the second light-blocking member to each other by irradiating the light-transmitting member with light having the prescribed wavelength laterally from a side of the light-transmitting member so as to cure the adhesive. Here, the step of providing the light-transmitting member on the front surface of the first light-blocking member is performed by the time of completion of the step of adhering the light-transmitting member and the second light-blocking member to each other at the latest. Then, in the adhesion method based on one or more embodiments of the present invention, through these steps, the first light-blocking member and the second light-blocking member are indirectly adhered to each other with the light-transmitting member being interposed.

In the adhesion method based on one or more embodiments of the present invention above, the step of providing the light-transmitting member on the front surface of the first light-blocking member may be performed before stacking the second light-blocking member on the front surface of the light-transmitting member. In that case, that step, according to one or more embodiments of the present invention, includes the step of forming the light-transmitting member in a layered manner on the front surface of the first light-blocking member so as to cover the front surface of the first light-blocking member.

In the adhesion method based on one or more embodiments of the present invention above, the step of providing the light-transmitting member on the front surface of the first light-blocking member may be performed before stacking the second light-blocking member on the front surface of the light-transmitting member. In that case, the step above, according to one or more embodiments of the present invention, includes the steps of applying the adhesive to at least any of the front surface of the first light-blocking member and a back surface of the light-transmitting member, stacking the light-transmitting member on the front surface of the first light-blocking member in such a manner that the front surface of the first light-blocking member and the back surface of the light-transmitting member are opposed to each other with the applied adhesive being interposed, and adhering the first light-blocking member and the light-transmitting member to each other by causing light having the prescribed wavelength to pass through the light-transmitting member and irradiating the light-transmitting member therewith so as to cure the adhesive.

In the adhesion method based on one or more embodiments of the present invention above, the step of providing the light-transmitting member on the front surface of the first light-blocking member may include the steps of applying the adhesive to at least any of the front surface of the first light-blocking member and a back surface of the light-transmitting member, stacking the light-transmitting member on the front surface of the first light-blocking member in such a manner that the front surface of the first light-blocking member and the back surface of the light-transmitting member are opposed to each other with the applied adhesive being interposed, and adhering the first light-blocking member and the light-transmitting member to each other by curing the adhesive. In that case, among these steps, the step of applying the adhesive and the step of stacking the light-transmitting member on the front surface of the first light-blocking member are, according to one or more embodiments of the present invention, performed before adhering the light-transmitting member and the second light-blocking member to each other, and, according to one or more embodiments of the present invention, the remaining step of adhering the first light-blocking member and the light-transmitting member to each other is performed by curing the adhesive with light having the prescribed wavelength emitted laterally from the side of the light-transmitting member toward the light-transmitting member in order to adhere the light-transmitting member and the second light-blocking member to each other, so that adhesion between the first light-blocking member and the light-transmitting member and adhesion between the light-transmitting member and the second light-blocking member are simultaneously carried out.

In the adhesion method based on one or more embodiments of the present invention above, the light-transmitting member, according to one or more embodiments of the present invention, contains a light-transmitting composition serving as a base material and a filler contained in a manner dispersed in the light-transmitting composition in order to scatter light emitted toward the light-transmitting member in the light-transmitting member.

In the adhesion method based on one or more embodiments of the present invention above, the filler may include a reflective filler for reflecting light having the prescribed wavelength at a surface thereof.

In the adhesion method based on one or more embodiments of the present invention above, the filler may include a light-transmitting filler different in index of refraction from the light-transmitting composition, for refracting light having the prescribed wavelength at a surface thereof. In that case, according to one or more embodiments of the present invention, a ratio of a total weight of the light-transmitting filler to a total weight of the light-transmitting member is 10% or higher.

An adhesion structure based on one or more embodiments of the present invention includes a light-transmitting member, a first light-blocking member, a second light-blocking member, and an adhesion layer. The light-transmitting member is a member allowing passage of light having a prescribed wavelength. The first light-blocking member is a member located on a side of a back surface of the light-transmitting member, that allows substantially no passage of light having the prescribed wavelength. The second light-blocking member is a second member located on a side of a front surface of the light-transmitting member, that allows substantially no passage of light having the prescribed wavelength. The adhesion layer is a layer located between at least any one of the first light-blocking member and the second light-blocking member and the light-transmitting member, for adhering the light-blocking member and the light-transmitting member to each other. The adhesion layer contains a light curing resin composition cured by irradiation with light having the prescribed wavelength. The first light-blocking member and the second light-blocking member are integrated with each other, with the light-transmitting member being interposed.

In the adhesion structure based on one or more embodiments of the present invention above, the light-transmitting member, according to one or more embodiments of the present invention, contains a light-transmitting composition serving as a base material and a filler contained in a manner dispersed in the light-transmitting composition in order to scatter light emitted toward the light-transmitting member in the light-transmitting member.

In the adhesion structure based on one or more embodiments of the present invention above, the filler may include a reflective filler for reflecting light having the prescribed wavelength at a surface thereof.

In the adhesion structure based on one or more embodiments of the present invention above, the filler may include a light-transmitting filler different in index of refraction from the light-transmitting composition, for refracting light having the prescribed wavelength at a surface thereof. In that case, according to one or more embodiments of the present invention, a ratio of a total weight of the light-transmitting filler to a total weight of the light-transmitting member is 10% or higher.

A method of manufacturing an optical module based on one or more embodiments of the present invention is a method of manufacturing an optical module including a light-transmitting member allowing passage of light having a prescribed wavelength, a base member located on a side of a back surface of the light-transmitting member, an optical semiconductor device mounted on a front surface of the base member and sealed with the light-transmitting member, a light guide path forming member located on a side of a front surface of the light-transmitting member, and an adhesion layer formed as a result of curing of an adhesive containing a light curing resin composition cured by irradiation with light having the prescribed wavelength, for adhering the light-transmitting member and the light guide path forming member to each other, and the method includes the following steps:

(a) Mounting the optical semiconductor device on the front surface of the base member;

(b) Sealing the front surface of the base member on which the optical semiconductor device has been mounted with the light-transmitting member formed in a layered manner;

(c) Applying the adhesive to at least any of the front surface of the light-transmitting member and a back surface of the light guide path forming member;

(d) Stacking the light guide path forming member on the front surface of the light-transmitting member in such a manner that the front surface of the light-transmitting member and the back surface of the light guide path forming member are opposed to each other with the applied adhesive being interposed; and (e) Adhering the light-transmitting member and the light guide path forming member to each other by irradiating the light-transmitting member with light having the prescribed wavelength laterally from a side of the light-transmitting member so as to cure the adhesive.

In the method of manufacturing an optical module based on one or more embodiments of the present invention above, the light-transmitting member, according to one or more embodiments of the present invention, contains a light-transmitting composition serving as a base material and a filler contained in a manner dispersed in the light-transmitting composition in order to scatter light emitted toward the light-transmitting member in the light-transmitting member.

In the method of manufacturing an optical module based on one or more embodiments of the present invention above, the filler may include a reflective filler for reflecting light having the prescribed wavelength at a surface thereof.

In the method of manufacturing an optical module based on one or more embodiments of the present invention above, the filler may include a light-transmitting filler different in index of refraction from the light-transmitting composition, for refracting light having the prescribed wavelength at a surface thereof. In that case, according to one or more embodiments of the present invention, a ratio of a total weight of the light-transmitting filler to a total weight of the light-transmitting member is 10% or higher.

An optical module based on one or more embodiments of the present invention includes a light-transmitting member, a base member, an optical semiconductor device, a light guide path forming member, and an adhesion layer. The light-transmitting member is a member allowing passage of light having a prescribed wavelength. The base member is a member located on a side of a back surface of the light-transmitting member. The optical semiconductor device is mounted on a front surface of the base member and sealed with the light-transmitting member. The light guide path forming member is located on a side of a front surface of the light-transmitting member. The adhesion layer adheres the light-transmitting member and the light guide path forming member to each other. Here, the adhesion layer contains a light curing resin composition cured by irradiation with light having the prescribed wavelength.

In the optical module based on one or more embodiments of the present invention above, the light-transmitting member, according to one or more embodiments of the present invention, contains a light-transmitting composition serving as a base material and a filler contained in a manner dispersed in the light-transmitting composition in order to scatter light emitted toward the light-transmitting member in the light-transmitting member.

In the optical module based on one or more embodiments of the present invention above, the filler may include a reflective filler for reflecting light having the prescribed wavelength at a surface thereof.

In the optical module based on one or more embodiments of the present invention above, the filler may include a light-transmitting filler different in index of refraction from the light-transmitting composition, for refracting light having the prescribed wavelength at a surface thereof. In that case, according to one or more embodiments of the present invention, a ratio of a total weight of the light-transmitting filler to a total weight of the light-transmitting member is 10% or higher.

According to one or more embodiments of the present invention, in adhering light-blocking members to each other by using an adhesive containing a light curing resin composition, an adhesion operation can easily and quickly be performed while ensuring sufficient adhesion strength.

In addition, according to one or more embodiments of the present invention, an optical module that can be manufactured with sufficient adhesion strength can easily and quickly be manufactured.

DETAILED DESCRIPTION

A "front surface" and a "back surface" of the first light-blocking member (also including such cases as being referred to as a base member or an interposer), the second light-blocking member (also including such cases as being referred to as a waveguide forming member or a reflector or a fiber guide), and the light-transmitting member (also including such cases as being referred to as a light-transmitting layer) used herein are terms for establishing a definition based on a case that, after the first light-blocking member and the second light-blocking member are indirectly adhered to each other with the light-transmitting member being interposed, these members are viewed from the side where the second light-blocking member is located. Namely, the "front surface" refers to a main surface located on a front side of main surfaces of these members located opposed to each other when these members are viewed from the side where the second light-blocking member is located, and the "back surface" refers to a main surface located on a rear side of main surfaces of these members located opposed to each other when these members are viewed from the side where the second light-blocking member is located. Therefore, after adhesion, the front surface of the first light-blocking member and the back surface of the light-transmitting member will be arranged opposed to each other without exception, and the front surface of the light-transmitting member and the back surface of the second light-blocking member will be arranged opposed to each other without exception.

Embodiments of the present invention will be described hereinafter in detail with reference to the drawings. In first to third embodiments shown below, general adhesion structure and adhesion method will be described without specifying a specific product, and in a fourth embodiment shown below, description will be given referring to an optical module as a specific product and exemplifying a case where one or more embodiments of the present invention is applied to the optical module. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

First Embodiment

Figure 1:
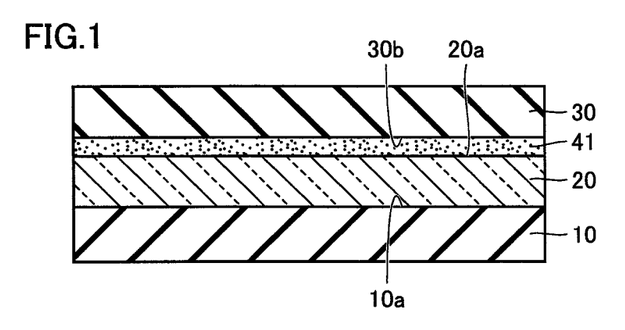
FIG. 1 is a schematic cross-sectional view showing an adhesion structure in a first embodiment of the present invention.

FIG. 1 is a schematic cross-sectional view showing an adhesion structure in the first embodiment of the present invention. Initially, the adhesion structure in the present embodiment will be described with reference to this FIG. 1.

As shown in FIG. 1, the adhesion structure in the present embodiment is formed by adhering a first light-blocking member 10 and a second light-blocking member 30, that are adhesion objects, to each other with an adhesion layer 41 being interposed. Here, a light-transmitting layer 20 formed in a layered manner and serving as the light-transmitting member is formed on a front surface 10a which is an adhesion surface of first light-blocking member 10, and adhesion layer 41 adheres and fixes a front surface 20a of this light-transmitting layer 20 and a back surface 30b of second light-blocking member 30 to each other.

Adhesion layer 41 is a layer at least containing a light curing resin composition, and it is cured by irradiation of a liquid light curing adhesive with light having a prescribed wavelength. Here, the "prescribed wavelength" refers to a wavelength capable of curing the light curing adhesive (a wavelength suitable for curing) and the wavelength is different depending on a specific material, characteristic and the like of the light curing adhesive. This adhesion layer 41 has its entirety sufficiently cured, and it is secured to front surface 20a of light-transmitting layer 20 and back surface 30b of second light-blocking member 30. For example, an ultraviolet curing adhesive cured by irradiation with ultraviolet rays, a visible light curing adhesive cured by irradiation with visible light, or the like is suitably made use of as the light curing adhesive, and more specifically, acrylic-resin-based and epoxy-resin-based light curing adhesives and the like are made use of. A thickness of adhesion layer 41 is not greater than 0.5 mm, which is at least a curing depth of a general light curing adhesive, and more suitably not smaller than 10 μm and not greater than 100 μm.

First light-blocking member 10 and second light-blocking member 30 are less-light-transmitting members allowing substantially no passage of light having a prescribed wavelength for curing the light curing adhesive described above. Here, "allowing substantially no passage" means that light having a wavelength suitable for curing the light curing adhesive described above is at least not allowed to pass through, and passage of light having a wavelength not suitable for curing the light curing adhesive may or may not be allowed. Though a material, a thickness, a shape, or the like of these first light-blocking member 10 and second light-blocking member 30 is not particularly restricted, from a point of view of adhesion using a light curing adhesive, an applicable range of the material, the thickness, the shape, or the like naturally exists. In particular, regarding the shape of first light-blocking member 10 and second light-blocking member 30, in connection with the curing depth of the light curing adhesive described above, a light-blocking member having an adhesion surface of 1.0 mm-square or greater or an adhesion surface having a diameter of 1.0 mm or greater is suitably made use of.

Light-transmitting layer 20 contains a light-transmitting composition, and it is formed, for example, with transfer molding on front surface 10a of first light-blocking member 10. Light-transmitting layer 20 suitably has a thickness approximately from 0.4 mm to 1.5 mm.

As described above, in the adhesion structure in the present embodiment, adhesion layer 41 interposed between light-transmitting layer 20 provided on front surface 10a of first light-blocking member 10 and second light-blocking member 30 adheres these light-transmitting layer 20 and second light-blocking member 30 to each other, so that adhesion and fixation (that is, integration) between first light-blocking member 10 and second light-blocking member 30 is realized.

Figure 2:
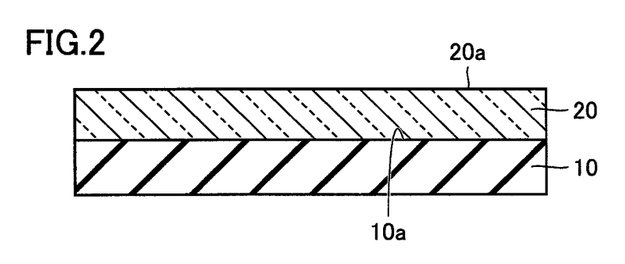
FIG. 2 is a diagram for illustrating an adhesion method in the first embodiment of the present invention.
Figure 3:
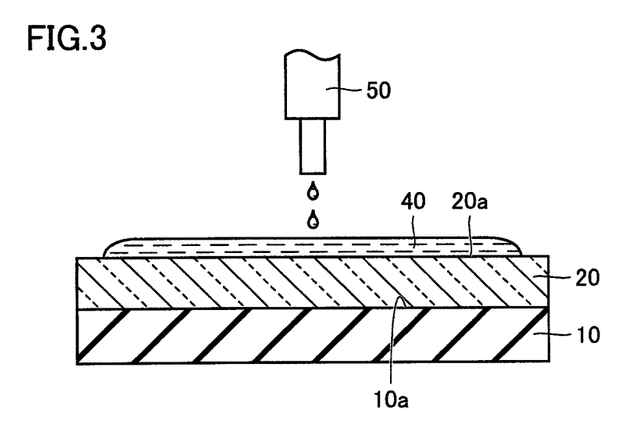
FIG. 3 is a diagram for illustrating the adhesion method in the first embodiment of the present invention.
Figure 4:
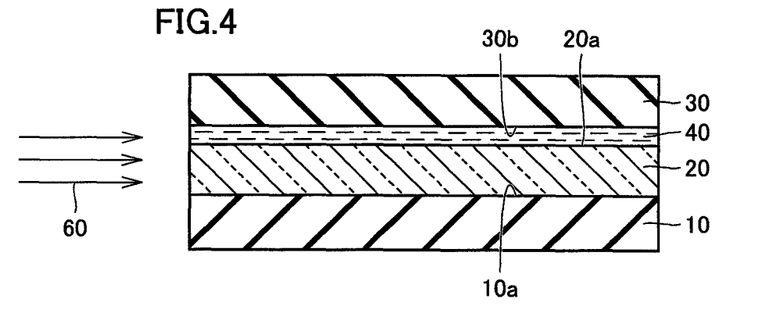
FIG. 4 is a diagram for illustrating the adhesion method in the first embodiment of the present invention.

FIGS. 2 to 4 are diagrams for illustrating an adhesion method in the first embodiment of the present invention. The adhesion method in the present embodiment for realizing the adhesion structure in the present embodiment described above will now be described with reference to these FIGS. 2 to 4.

Initially, as shown in FIG. 2, light-transmitting layer 20 is formed on front surface 10a of first light-blocking member 10 serving as the adhesion object, for example, with transfer molding.

Then, as shown in FIG. 3, a liquid light curing adhesive 40 is applied onto front surface 20a of light-transmitting layer 20, for example, by using a dispenser 50. An amount of application at that time is set to an amount sufficient for adhesion layer 41 after curing (see FIG. 1) to have a prescribed thickness.

Then, as shown in FIG. 4, second light-blocking member 30 is stacked on front surface 20a of light-transmitting layer 20 to which light curing adhesive 40 has been applied, such that front surface 20a of light-transmitting layer 20 and back surface 30b of second light-blocking member 30 are opposed to each other. Here, according to one or more embodiments of the present invention, a state that back surface 30b of second light-blocking member 30 and front surface 20a of light-transmitting layer 20 are spaced apart from each other by a prescribed distance is maintained, with a gap between these second light-blocking member 30 and light-transmitting layer 20 being filled with liquid light curing adhesive 40.

Then, while maintaining the state above, light having a prescribed wavelength for curing light curing adhesive 40 is emitted laterally from the side of light-transmitting layer 20 toward light-transmitting layer 20 (in the drawing, a direction of light irradiation is shown with an arrow 60).

Here, light-transmitting layer 20 forms a course of light for curing light curing adhesive 40, and light spreads over light curing adhesive 40 through this light-transmitting layer 20. Here, owing to an interface reflection action and an internal scattering action of light-transmitting layer 20 on the light, the light scatters in light-transmitting layer 20 although the extent thereof is small, and thus the light reaches the light curing adhesive at a greater depth from the side surface. Here, because the layer of light curing adhesive 40 has a thickness smaller than the curing depth of light curing adhesive 40 as described above, the light scattered in light-transmitting layer 20 and having reached light curing adhesive 40 promotes curing reaction in the entire region in the layer of light curing adhesive 40 and light curing adhesive 40 is cured in its entirety. Thus, adhesion layer 41 interposed between light-transmitting layer 20 and second light-blocking member 30 firmly adheres these light-transmitting layer 20 and second light-blocking member 30 to each other and adhesion and fixation between first light-blocking member 10 and second light-blocking member 30 that are the adhesion objects is realized, so that the adhesion structure in FIG. 1 described above is obtained.

It is noted that light having a prescribed wavelength for curing light curing adhesive 40 described above does not necessarily have to be emitted only toward light-transmitting layer 20, and in irradiation, it may be emitted not only toward the side surface of light-transmitting layer 20 but also toward the side surface of the layer of liquid light curing adhesive 40. In addition, though the light is, according to one or more embodiments of the present invention, emitted in a direction of normal of the side surface of light-transmitting layer 20, the light may be incident obliquely at a certain angle.

By realizing the adhesion structure as in the present embodiment described above by using the adhesion method as in the present embodiment described above, first light-blocking member 10 and second light-blocking member 30 can be adhered to each other by using light curing adhesive 40 with sufficient adhesion strength. Specifically, as described above, light-transmitting layer 20 forms a course of light for curing light curing adhesive 40, the light scatters in light-transmitting layer 20 owing to the interface reflection action and the internal scattering action of light-transmitting layer 20 on the light, and thus light curing adhesive 40 is cured in its entirety. Consequently, as compared with a case where light-transmitting layer 20 is not provided, adhesion strength between first light-blocking member 10 and second light-blocking member 30 can be enhanced. In addition, the adhesion operation itself remains the same as the conventional adhesion operation in which light curing adhesive 40 is applied to the adhesion object, which is in turn irradiated with light, and hence the operation ends very easily in a short period of time. Therefore, by adopting the adhesion structure and the adhesion method as in the present embodiment, the adhesion operation can easily and quickly be performed while ensuring sufficient adhesion strength.

Second Embodiment

Figure 5:
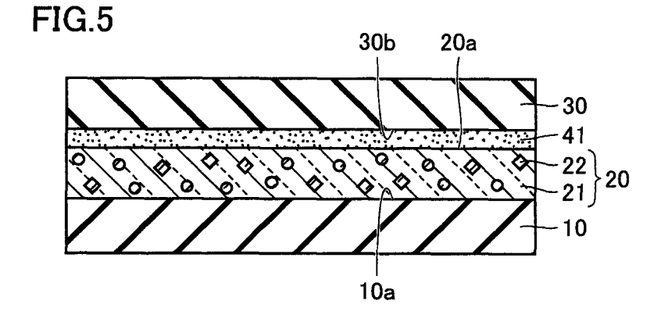
FIG. 5 is a schematic cross-sectional view showing an adhesion structure in a second embodiment of the present invention.

FIG. 5 is a schematic cross-sectional view showing an adhesion structure in the second embodiment of the present invention. Initially, the adhesion structure in the present embodiment will be described with reference to this FIG. 5. It is noted that a portion similar to that in the adhesion structure in the first embodiment described above has the same reference character allotted and detailed description thereof will not be repeated.

As shown in FIG. 5, the adhesion structure in the present embodiment is formed by adhering first light-blocking member 10 and second light-blocking member 30, that are adhesion objects, to each other with adhesion layer 41 being interposed, as in the adhesion structure in the first embodiment described above. Here, light-transmitting layer 20 formed in a layered manner and serving as the light-transmitting member is formed on front surface 10a which is an adhesion surface of first light-blocking member 10, and adhesion layer 41 adheres and fixes front surface 20a of this light-transmitting layer 20 and back surface 30b of second light-blocking member 30 to each other. The adhesion structure in the present embodiment is different from the adhesion structure in the first embodiment described above only in construction of light-transmitting layer 20.

Light-transmitting layer 20 is a layer substantially allowing passage of light having a prescribed wavelength for curing a light curing adhesive, and contains a light-transmitting composition 21 serving as a base material and a light-transmitting filler 22 contained in this light-transmitting composition 21 in a dispersed manner. Here, "substantially allowing passage" means that light having a wavelength suitable for curing the light curing adhesive described above is at least allowed to pass through, and passage of light having a wavelength not suitable for curing the light curing adhesive may or may not be allowed. An epoxy resin or an epoxy-based resin, a silicone resin, or a resin mixture thereof is suitably made use of as light-transmitting composition 21. Light-transmitting filler 22 is made of a filler different in index of refraction from light-transmitting composition 21 described above, and a glass-based filler is suitably made use of. It is noted that light-transmitting filler 22 may be in any shape so long as it is particulate, and for example, a filler in a spherical shape, a cubic shape, or the like is suitably made use of. Light-transmitting layer 20 is formed, for example, with transfer molding on front surface 10a of first light-blocking member 10. Light-transmitting layer 20 suitably has a thickness approximately from 0.4 mm to 1.5 mm. In addition, regarding an amount of light-transmitting filler 22 contained in light-transmitting layer 20, at least a small amount of light-transmitting filler 22 should only be contained, however, more suitably, a ratio of the total weight of light-transmitting filler 22 to the total weight of light-transmitting layer 20 is 10% or higher and further suitably not lower than 10% and not higher than 50%. Though a size of light-transmitting filler 22 is not particularly limited either, a small filler having a particle size approximately from $\phi 10$ μm to $\phi 100$ μm is, according to one or more embodiments of the present invention, made use of.

As described above, in the adhesion structure in the present embodiment, adhesion layer 41 interposed between light-transmitting layer 20 provided on front surface 10a of first light-blocking member 10 and second light-blocking member 30 adheres these light-transmitting layer 20 and second light-blocking member 30 to each other, so that adhesion and fixation between first light-blocking member 10 and second light-blocking member 30 is realized and light-transmitting layer 20 contains light-transmitting filler 22.

Figure 6:
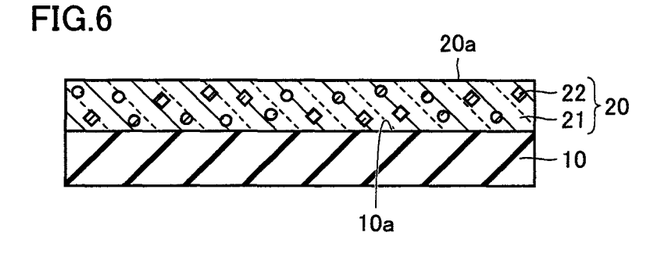
FIG. 6 is a diagram for illustrating an adhesion method in the second embodiment of the present invention.
Figure 7:
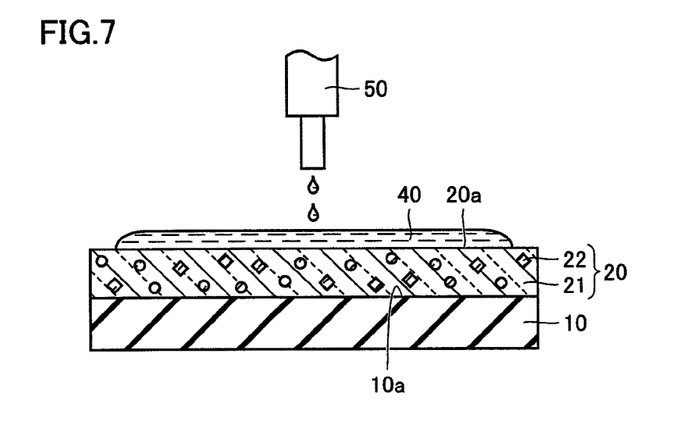
FIG. 7 is a diagram for illustrating the adhesion method in the second embodiment of the present invention.
Figure 8:
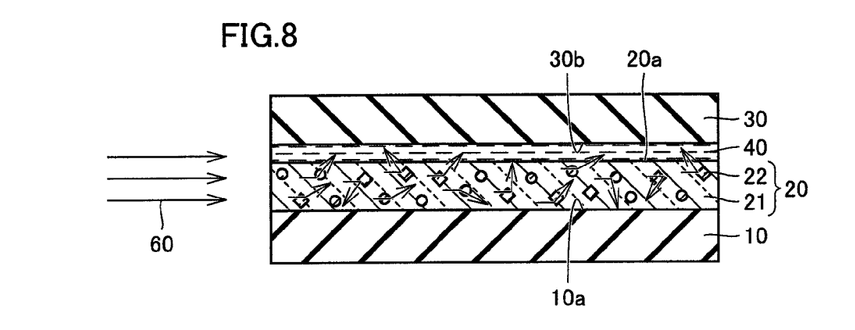
FIG. 8 is a diagram for illustrating the adhesion method in the second embodiment of the present invention.

FIGS. 6 to 8 are diagrams for illustrating the adhesion method in the second embodiment of the present invention. The adhesion method in the present embodiment for realizing the adhesion structure in the present embodiment described above will now be described with reference to these FIGS. 6 to 8.

Initially, as shown in FIG. 6, light-transmitting layer 20 containing light-transmitting composition 21 as the base material, in which light-transmitting filler 22 is contained in a dispersed manner, is formed on front surface 10a of first light-blocking member 10 serving as the adhesion object, for example, with transfer molding.

Then, as shown in FIG. 7, liquid light curing adhesive 40 is applied onto front surface 20a of light-transmitting layer 20, for example, by using dispenser 50. An amount of application at that time is set to an amount sufficient for adhesion layer 41 after curing (see FIG. 5) to have a prescribed thickness.

Then, as shown in FIG. 8, second light-blocking member 30 is stacked on front surface 20a of light-transmitting layer 20 to which light curing adhesive 40 has been applied, such that front surface 20a of light-transmitting layer 20 and back surface 30b of second light-blocking member 30 are opposed to each other. Here, according to one or more embodiments of the present invention, a state that back surface 30b of second light-blocking member 30 and front surface 20a of light-transmitting layer 20 are spaced apart from each other by a prescribed distance is maintained, with a gap between these second light-blocking member 30 and light-transmitting layer 20 being filled with liquid light curing adhesive 40.

Then, while maintaining the state above, light having a prescribed wavelength for curing light curing adhesive 40 is emitted laterally from the side of light-transmitting layer 20 toward light-transmitting layer 20 (in the drawing, a direction of light irradiation is shown with arrow 60).

Here, light-transmitting layer 20 forms a course of light for curing light curing adhesive 40, and light spreads over light curing adhesive 40 through this light-transmitting layer 20. Specifically, the light above introduced in light-transmitting layer 20 is mainly refracted at an interface between light-transmitting composition 21 and light-transmitting filler 22 based on a difference between an index of refraction of light-transmitting composition 21 and an index of refraction of light-transmitting filler 22 and partially reflected at the interface between light-transmitting composition 21 and light-transmitting filler 22. Thus, owing to an interface reflection action, an interface refraction action and an internal scattering action of light-transmitting layer 20 on the light, the light scatters in light-transmitting layer 20 and thus the light efficiently reaches the light curing adhesive at a greater depth from the side surface. Here, since the layer of light curing adhesive 40 has a thickness smaller than the curing depth of light curing adhesive 40 as described above, the light scattered in light-transmitting layer 20 and having reached light curing adhesive 40 promotes curing reaction in the entire region in the layer of light curing adhesive 40 and light curing adhesive 40 is cured in its entirety. Thus, adhesion layer 41 interposed between light-transmitting layer 20 and second light-blocking member 30 firmly adheres these light-transmitting layer 20 and second light-blocking member 30 to each other and adhesion and fixation between first light-blocking member 10 and second light-blocking member 30 that are the adhesion objects is realized, so that the adhesion structure in FIG. 5 described above is obtained.

By realizing the adhesion structure as in the present embodiment described above by using the adhesion method as in the present embodiment described above, first light-blocking member 10 and second light-blocking member 30 can be adhered to each other by using light curing adhesive 40 with sufficient adhesion strength. Specifically, as described above, light-transmitting layer 20 forms a course of light for curing light curing adhesive 40, the light scatters in light-transmitting layer 20 owing to the interface reflection action, the interface refraction action and the internal scattering action of light-transmitting layer 20 on the light, and thus light curing adhesive 40 is cured in its entirety. Consequently, as compared with a case where light-transmitting layer 20 is not provided, adhesion strength between first light-blocking member 10 and second light-blocking member 30 can be enhanced. In addition, the adhesion operation itself remains the same as the conventional adhesion operation in which light curing adhesive 40 is applied to the adhesion object which is in turn irradiated with light, and hence the operation ends very easily in a short period of time. Therefore, by adopting the adhesion structure and the adhesion method as in the present embodiment, the adhesion operation can easily and quickly be performed while ensuring sufficient adhesion strength.

Figure 9:
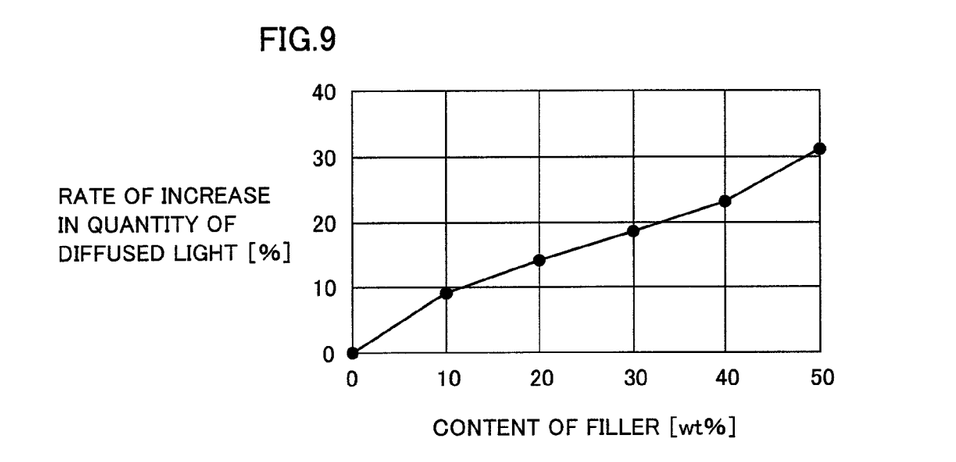
FIG. 9 is a graph showing results in verification tests in which improvement in adhesion strength was checked when the adhesion structure shown in FIG. 5 was adopted.
Figure 10:
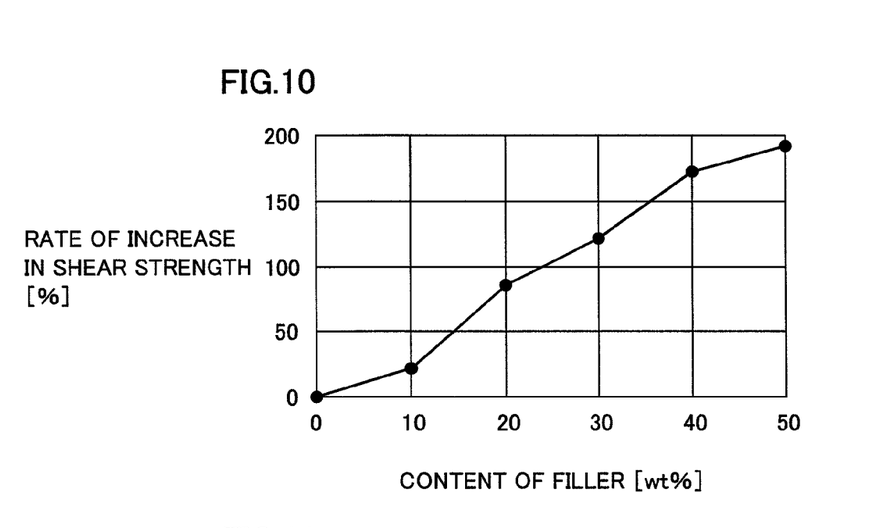
FIG. 10 is a graph showing results in the verification tests in which improvement in adhesion strength was checked when the adhesion structure shown in FIG. 5 was adopted.
Figure 11:
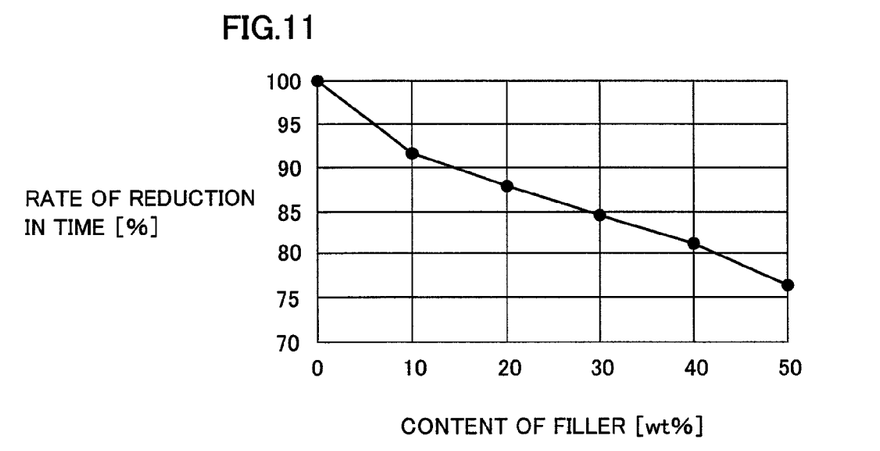
FIG. 11 is a graph showing results in the verification tests in which a rate of reduction in time was checked when the adhesion method shown in FIGS. 6 to 8 was adopted.

FIGS. 9 to 11 are graphs showing results in verification tests in which improvement in adhesion strength was checked when the adhesion structure and the adhesion method in the present embodiment described above were adopted. Among these figures, FIG. 9 is a graph showing relation between a content of the light-transmitting filler with which the light-transmitting layer is filled and a rate of increase in a quantity of diffused light reaching a light curing adhesion layer when the adhesion structure and the adhesion method above are adopted, FIG. 10 is a graph showing relation between a content of the light-transmitting filler with which the light-transmitting layer is filled and a rate of increase in adhesion strength, and FIG. 11 is a graph showing relation between a content of the light-transmitting filler with which the light-transmitting layer is filled and a rate of reduction in time required for the adhesion operation.

The test results shown in FIG. 9 were obtained by arranging light quantity sensors on entire back surface 30b of second light-blocking member 30 in the adhesion structure shown in FIG. 5 and verifying how much light reached a sensing surface of a light quantity sensor by using a plurality of samples in irradiation with light having a prescribed wavelength for adhesion with the light curing adhesive. As can be understood from FIG. 9, it can be seen that the quantity of diffused light reaching the sensing surface of the light quantity sensor above increases with the increase in the content of light-transmitting filler 22 dispersed in light-transmitting layer 20. Specifically, when the content of the filler is 10 wt %, increase in the diffused light by approximately 10% as compared with a case where the filler is not dispersed was confirmed, and when the content of the filler is 50 wt %, increase in the diffused light by approximately 30% as compared with a case where the filler is not dispersed was confirmed.

In addition, the test results shown in FIG. 10 were obtained by preparing a plurality of samples each having the adhesion structure shown in FIG. 5, applying shear stress to first light-blocking member 10 and second light-blocking member 30, and verifying adhesion strength (shear strength) based on shear stress at which failure in adhesion between first light-blocking member 10 and second light-blocking member 30 occurs. As can be understood from FIG. 10, it can be seen that shear strength increases with the increase in the content of light-transmitting filler 22 dispersed in light-transmitting layer 20. Specifically, when the content of the filler is 10 wt %, increase in the shear strength by approximately 25% as compared with a case where the filler is not dispersed was confirmed, and when the content of the filler is 50 wt %, increase in the shear strength by approximately 200% as compared with a case where the filler is not dispersed was confirmed.

Moreover, FIG. 11 shows verification of how much time is required for curing the light curing adhesive when the adhesion method shown in FIGS. 6 to 8 was employed, based on the test results in FIG. 9. As can be understood from FIG. 11, it can be seen that the time required for curing is reduced with the increase in the content of light-transmitting filler 22 dispersed in light-transmitting layer 20. Specifically, when the content of the filler is 10 wt %, reduction in time by approximately 8% as compared with a case where the filler is not dispersed was confirmed, and when the content of the filler is 50 wt %, reduction in time by approximately 24% as compared with a case where the filler is not dispersed was confirmed.

Based on the results in the verification tests above, it was confirmed that adhesion strength significantly improves by adopting the adhesion structure and the adhesion method as in the present embodiment.

Third Embodiment

Figure 12:
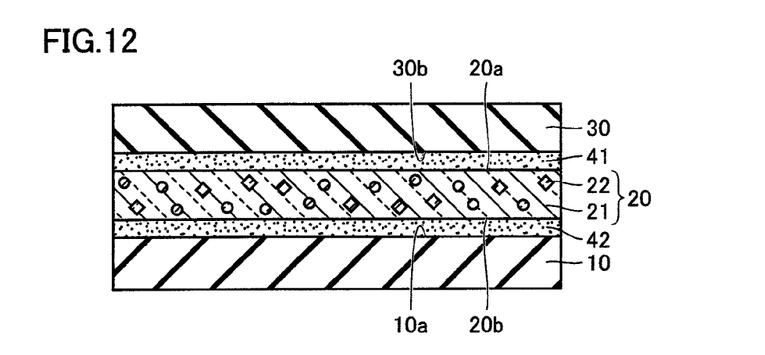
FIG. 12 is a schematic cross-sectional view showing an adhesion structure in a third embodiment of the present invention.

FIG. 12 is a schematic cross-sectional view showing an adhesion structure in the third embodiment of the present invention. Initially, the adhesion structure in the present embodiment will be described with reference to this FIG. 12. It is noted that a portion similar to that in the adhesion structure in the first embodiment described above has the same reference character allotted and detailed description thereof will not be repeated.

As shown in FIG. 12, the adhesion structure in the present embodiment is formed by adhering first light-blocking member 10 and second light-blocking member 30, that are the adhesion objects, to each other by using adhesion layers 41, 42, with light-transmitting layer 20 being interposed. Here, light-transmitting layer 20 lies between first light-blocking member 10 and second light-blocking member 30, adhesion layer 41 adheres and fixes front surface 20a of light-transmitting layer 20 and back surface 30b of second light-blocking member 30 to each other, and adhesion layer 42 adheres and fixes back surface 20b of light-transmitting layer 20 and front surface 10a of first light-blocking member 10.

Unlike the adhesion structure in the first embodiment described above, light-transmitting layer 20 itself is formed as one member, and it is formed, for example, with transfer molding. Therefore, before the adhesion operation, light-transmitting layer 20, first light-blocking member 10 and second light-blocking member 30 are each constructed as an independent and separate part. In addition, in the adhesion structure in the present embodiment, a component containing light-transmitting composition 21 serving as the base material and light-transmitting filler 22 contained in this light-transmitting composition 21 in a dispersed manner that was adopted in the second embodiment described above is adopted as light-transmitting layer 20.

Adhesion layer 41, 42 is a layer containing at least a light curing resin composition, and it is cured by irradiation of a liquid light curing adhesive with light having a prescribed wavelength. This adhesion layer 41, 42 has its entirety sufficiently cured, and adhesion layer 41 is secured to front surface 20a of light-transmitting layer 20 and back surface 30b of second light-blocking member 30 and adhesion layer 42 is secured to back surface 20b of light-transmitting layer 20 and front surface 10a of first light-blocking member 10.

In the adhesion structure in the present embodiment, adhesion layer 42 interposed between first light-blocking member 10 and light-transmitting layer 20 adheres these first light-blocking member 10 and light-transmitting layer 20 to each other and adhesion layer 41 interposed between light-transmitting layer 20 and second light-blocking member 30 adheres these light-transmitting layer 20 and second light-blocking member 30 to each other, so that adhesion and fixation between first light-blocking member 10 and second light-blocking member 30 is realized.

FIGS. 13 to 16 are diagrams for illustrating an adhesion method in the third embodiment of the present invention. The adhesion method in the present embodiment for realizing the adhesion structure in the present embodiment described above will now be described with reference to these FIGS. 13 to 16.

Figure 13:
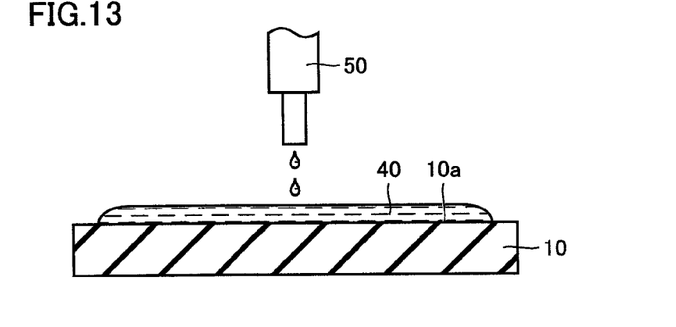
FIG. 13 is a diagram for illustrating an adhesion method in the third embodiment of the present invention.

Initially, as shown in FIG. 13, liquid light curing adhesive 40 is applied onto front surface 10a of first light-blocking member 10 which is the adhesion object, for example, by using dispenser 50. An amount of application at that time is set to an amount sufficient for adhesion layer 42 after curing (see FIG. 12) to have a prescribed thickness.

Figure 14:
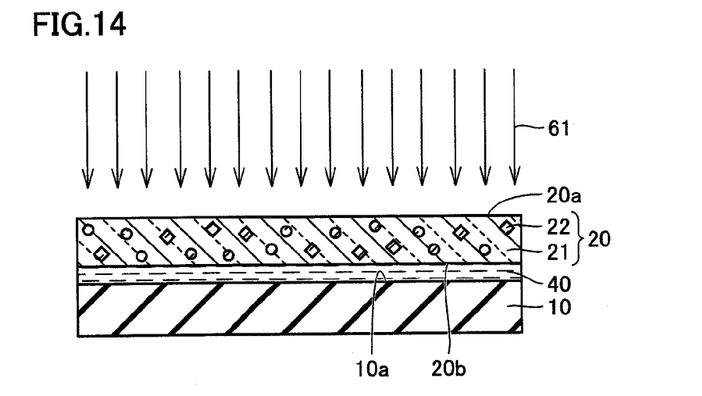
FIG. 14 is a diagram for illustrating the adhesion method in the third embodiment of the present invention.

Then, as shown in FIG. 14, light-transmitting layer 20 containing light-transmitting composition 21 as the base material, in which light-transmitting filler 22 is contained in a dispersed manner, is stacked on front surface 10a of first light-blocking member 10 to which light curing adhesive 40 has been applied, such that front surface 10a of first light-blocking member 10 and back surface 20b of light-transmitting layer 20 are opposed to each other. Here, according to one or more embodiments of the present invention, a state that back surface 20b of light-transmitting layer 20 and front surface 10a of first light-blocking member 10 are spaced apart from each other by a prescribed distance is maintained, with a gap between these first light-blocking member 10 and light-transmitting layer 20 being filled with liquid light curing adhesive 40.

Then, while maintaining the state above, light having a prescribed wavelength for curing light curing adhesive 40 is emitted from above light-transmitting layer 20 (that is, from the side of front surface 20a of light-transmitting layer 20) toward light-transmitting layer 20 (in the drawing, a direction of light irradiation is shown with an arrow 61). The light emitted from above light-transmitting layer 20 passes through light-transmitting layer 20 and light curing adhesive 40 is irradiated therewith, so that light curing adhesive 40 is cured. Thus, adhesion layer 42 interposed between first light-blocking member 10 and light-transmitting layer 20 firmly adheres these first light-blocking member 10 and light-transmitting layer 20 to each other.

Figure 15:
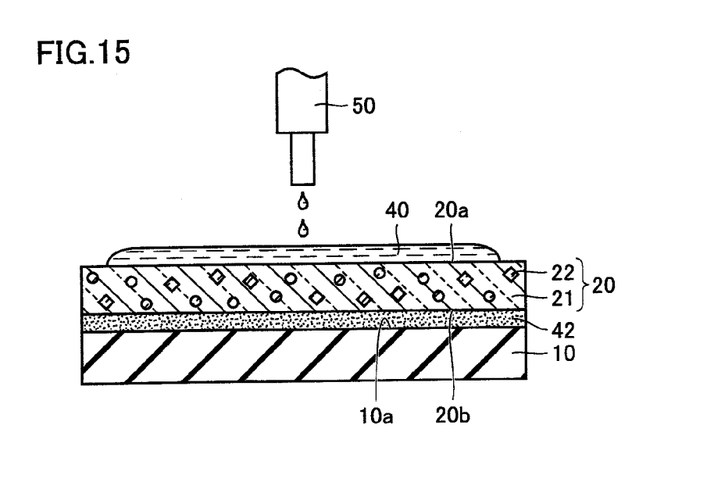
FIG. 15 is a diagram for illustrating the adhesion method in the third embodiment of the present invention.

Then, as shown in FIG. 15, liquid light curing adhesive 40 is applied onto front surface 20a of light-transmitting layer 20, for example, by using dispenser 50. An amount of application at that time is set to an amount sufficient for adhesion layer 41 after curing (see FIG. 12) to have a prescribed thickness.

Figure 16:
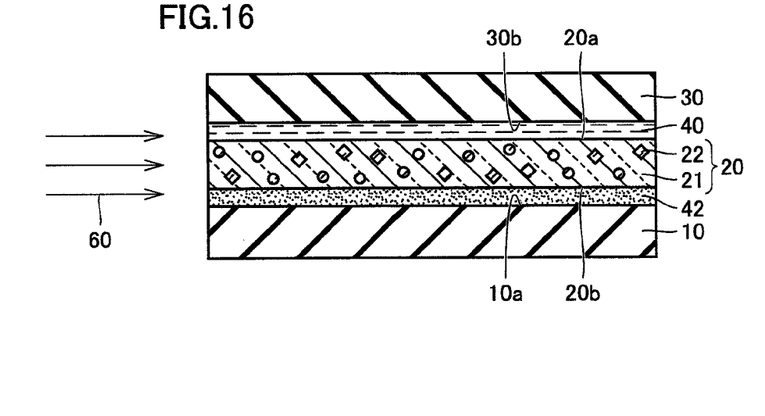
FIG. 16 is a diagram for illustrating the adhesion method in the third embodiment of the present invention.

Then, as shown in FIG. 16, second light-blocking member 30 is stacked on front surface 20a of light-transmitting layer 20 to which light curing adhesive 40 has been applied, such that front surface 20a of light-transmitting layer 20 and back surface 30b of second light-blocking member 30 are opposed to each other. Here, according to one or more embodiments of the present invention, a state that back surface 30b of second light-blocking member 30 and front surface 20a of light-transmitting layer 20 are spaced apart from each other by a prescribed distance is maintained, with a gap between these second light-blocking member 30 and light-transmitting layer 20 being filled with liquid light curing adhesive 40.

Then, while maintaining the state above, light having a prescribed wavelength for curing light curing adhesive 40 is emitted laterally from the side of light-transmitting layer 20 toward light-transmitting layer 20 (in the drawing, a direction of light irradiation is shown with arrow 60).

Here, light-transmitting layer 20 forms a course of light for curing light curing adhesive 40, and light spreads over light curing adhesive 40 through this light-transmitting layer 20. Specifically, the light above introduced in light-transmitting layer 20 is mainly refracted at the interface between light-transmitting composition 21 and light-transmitting filler 22 based on a difference between an index of refraction of light-transmitting composition 21 and an index of refraction of light-transmitting filler 22 and partially reflected at the interface between light-transmitting composition 21 and light-transmitting filler 22. Thus, owing to the interface reflection action, the interface refraction action and the internal scattering action of light-transmitting layer 20 on the light, the light scatters in light-transmitting layer 20 and thus the light efficiently reaches the light curing adhesive at a greater depth from the side surface. Here, since the layer of light curing adhesive 40 has a thickness smaller than the curing depth of light curing adhesive 40 as described above, the light scattered in light-transmitting layer 20 and having reached light curing adhesive 40 promotes curing reaction in the entire region in the layer of light curing adhesive 40 and light curing adhesive 40 is cured in its entirety. Thus, adhesion layer 41 interposed between light-transmitting layer 20 and second light-blocking member 30 firmly adheres these light-transmitting layer 20 and second light-blocking member 30 to each other and adhesion and fixation between first light-blocking member 10 and second light-blocking member 30 that are the adhesion objects is realized, so that the adhesion structure in FIG. 12 described above is obtained.

By realizing the adhesion structure as in the present embodiment described above by using the adhesion method as in the present embodiment described above, the adhesion operation can easily and quickly be performed while ensuring sufficient adhesion strength, as in the first embodiment described above.

Figure 17:
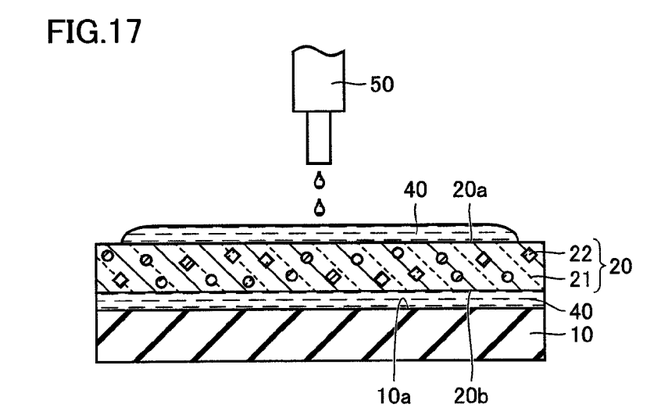
FIG. 17 is a diagram for illustrating another example of the adhesion method in the third embodiment of the present invention.
Figure 18:
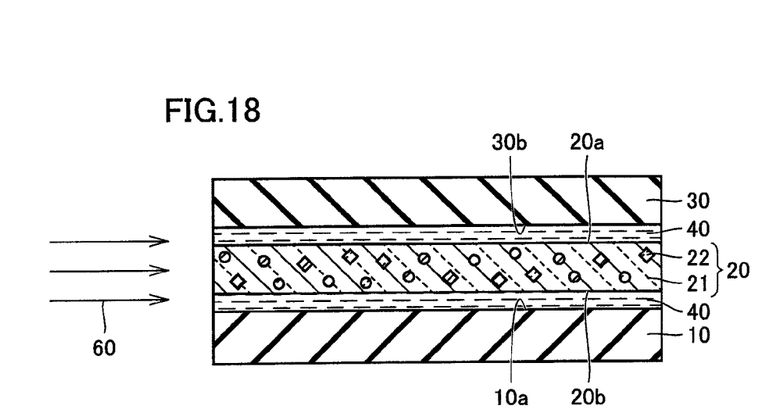
FIG. 18 is a diagram for illustrating another example of the adhesion method in the third embodiment of the present invention.

FIGS. 17 and 18 are diagrams for illustrating another example of the adhesion method in the third embodiment of the present invention. Another example of the adhesion method in the present embodiment for realizing the adhesion structure in the present embodiment described above will now be described with reference to these FIGS. 17 and 18 and FIG. 13 described previously.

Initially, as shown in FIG. 13, liquid light curing adhesive 40 is applied onto front surface 10a of first light-blocking member 10 which is the adhesion object, for example, by using dispenser 50. An amount of application at that time is set to an amount sufficient for adhesion layer 42 after curing (see FIG. 12) to have a prescribed thickness.

Then, as shown in FIG. 17, light-transmitting layer 20 containing light-transmitting composition 21 as the base material, in which light-transmitting filler 22 is contained in a dispersed manner, is stacked on front surface 10a of first light-blocking member 10 to which light curing adhesive 40 has been applied, such that front surface 10a of first light-blocking member 10 and back surface 20b of light-transmitting layer 20 are opposed to each other. Here, according to one or more embodiments of the present invention, a state that back surface 20b of light-transmitting layer 20 and front surface 10a of first light-blocking member 10 are spaced apart from each other by a prescribed distance is maintained, with a gap between these first light-blocking member 10 and light-transmitting layer 20 being filled with liquid light curing adhesive 40.

Then, liquid light curing adhesive 40 is applied onto front surface 20a of light-transmitting layer 20, for example, by using dispenser 50. An amount of application at that time is set to an amount sufficient for adhesion layer 41 after curing (see FIG. 12) to have a prescribed thickness.

Then, as shown in FIG. 18, second light-blocking member 30 is stacked on front surface 20a of light-transmitting layer 20 to which light curing adhesive 40 has been applied, such that front surface 20a of light-transmitting layer 20 and back surface 30b of second light-blocking member 30 are opposed to each other. Here, according to one or more embodiments of the present invention, a state that back surface 30b of second light-blocking member 30 and front surface 20a of light-transmitting layer 20 are spaced apart from each other by a prescribed distance is maintained, with a gap between these second light-blocking member 30 and light-transmitting layer 20 being filled with liquid light curing adhesive 40.

Then, while maintaining the state above, light having a prescribed wavelength for curing light curing adhesive 40 is emitted laterally from the side of light-transmitting layer 20 toward light-transmitting layer 20 (in the drawing, a direction of light irradiation is shown with arrow 60).

Here, light-transmitting layer 20 forms a course of light for curing light curing adhesive 40, and light spreads over light curing adhesive 40 through this light-transmitting layer 20. Specifically, the light above introduced in light-transmitting layer 20 is mainly refracted at the interface between light-transmitting composition 21 and light-transmitting filler 22 based on a difference between an index of refraction of light-transmitting composition 21 and an index of refraction of light-transmitting filler 22 and partially reflected at the interface between light-transmitting composition 21 and light-transmitting filler 22. Thus, owing to the interface reflection action, the interface refraction action and the internal scattering action of light-transmitting layer 20 on the light, the light scatters in light-transmitting layer 20 and thus the light efficiently reaches the light curing adhesive at a greater depth from the side surface. Here, since the layer of light curing adhesive 40 has a thickness smaller than the curing depth of light curing adhesive 40 as described above, the light scattered in light-transmitting layer 20 and having reached light curing adhesive 40 promotes curing reaction in the entire region in the layer of light curing adhesive 40 and light curing adhesive 40 is cured in its entirety. Thus, cured adhesion layer 41 interposed between light-transmitting layer 20 and second light-blocking member 30 firmly adheres these light-transmitting layer 20 and second light-blocking member 30 to each other and cured adhesion layer 42 interposed between light-transmitting layer 20 and first light-blocking member 10 firmly adheres these light-transmitting layer 20 and first light-blocking member 10 to each other. Thus, adhesion and fixation between first light-blocking member 10 and second light-blocking member 30 that are the adhesion objects is realized, so that the adhesion structure in FIG. 12 described above is obtained.

By realizing the adhesion structure as in the present embodiment described above by using the adhesion method as in the present embodiment described above, the adhesion operation can easily and quickly be performed while ensuring sufficient adhesion strength, as in the first embodiment described above.

Fourth Embodiment

Figure 19:
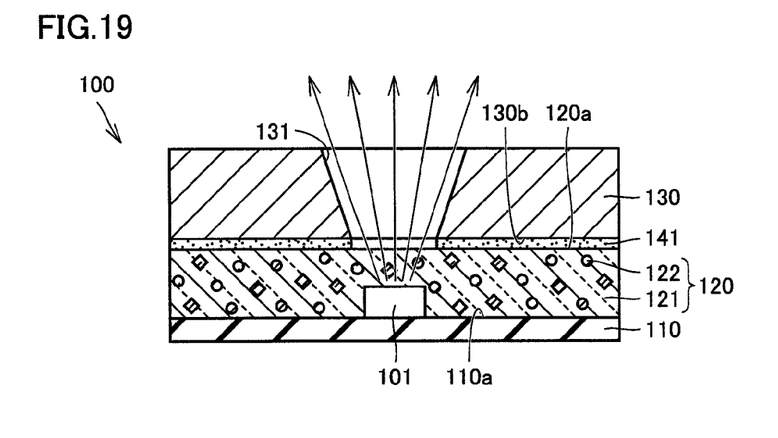
FIG. 19 is a schematic cross-sectional view showing a structure of an optical module in a fourth embodiment of the present invention.

FIG. 19 is a schematic cross-sectional view showing a structure of an optical module in the fourth embodiment of the present invention. Initially, the structure of the optical module in the present embodiment will be described with reference to this FIG. 19. It is noted that the adhesion structure in the second embodiment described above is applied to the structure of the optical module in the present embodiment.

As shown in FIG. 19, an optical module 100 in the present embodiment includes an LED chip 101 representing an optical semiconductor device, an interposer 110 which is a base member serving as the first light-blocking member, a light-transmitting layer 120 serving as the light-transmitting member formed in a layered manner, a reflector 130 which is a light guide path forming member serving as the second light-blocking member, and an adhesion layer 141.

Interposer 110 is implemented, for example, by a substantially rectangular, plate-shaped printed circuit board. An organic substrate such as a glass epoxy substrate is suitably made use of as this printed circuit board. Not-shown lands and interconnections are formed on front and back surfaces of interposer 110. It is noted that interposer 110 having a thickness approximately from 0.1 mm to 0.8 mm is suitably made use of.

LED chip 101 is mounted on a front surface 110a of interposer 110. More specifically, LED chip 101 is adhered to front surface 110a of interposer 110 with a conductive or insulating adhesive serving as a die bond material. LED chip 101 corresponds to a light source that radially emits light.

Light-transmitting layer 120 seals entire front surface 110a of interposer 110, on which LED chip 101 is mounted. Light-transmitting layer 120 contains a light-transmitting composition 121 serving as the base material and a light-transmitting filler 122 dispersed in this light-transmitting composition 121. Light-transmitting layer 120 is a layer substantially allowing passage of light having a prescribed wavelength for curing a light curing adhesive to serve as adhesion layer 141 and it is also a layer allowing passage of light emitted from LED chip 101.

Here, an epoxy resin or an epoxy-based resin, a silicone resin, or a resin mixture thereof is suitably made use of as light-transmitting composition 121. Light-transmitting filler 122 is made of a filler different in index of refraction from light-transmitting composition 121 described above, and a glass-based filler is suitably made use of. It is noted that light-transmitting filler 122 may be in any shape so long as it is particulate, and for example, a filler in a spherical shape, a cubic shape, or the like is suitably made use of.

Light-transmitting layer 120 is formed, for example, with transfer molding on front surface 110a of interposer 110. Light-transmitting layer 120 suitably has a thickness approximately from 0.4 mm to 1.5 mm. In addition, regarding an amount of light-transmitting filler 122 contained in light-transmitting layer 120, at least a small amount of light-transmitting filler 122 should only be contained, however, more suitably, a ratio of the total weight of light-transmitting filler 122 to the total weight of light-transmitting layer 120 is 10% or higher and further suitably not lower than 10% and not higher than 50%. Though a size of light-transmitting filler 122 is not particularly limited either, a small filler having a particle size approximately from $\phi$10 μm to $\phi$100 μm is, according to one or more embodiments of the present invention, made use of.

Reflector 130 is made of a member in a shape of a block or a plate having a large thickness, and has an opening 131 at a portion located above LED chip 101. Reflector 130 is a member for efficiently collecting light emitted from LED chip 101 in a prescribed direction, and it is made, for example, of a member of metal such as aluminum or an aluminum alloy. Opening 131 provided in reflector 130 has a shape of a frustum, and an inner circumferential surface of reflector 130 in a portion defining opening 131 is, for example, mirror-finished, in order to function as a reflection surface where emitted light is reflected. It is noted that reflector 130 is formed, for example, with press working, cutting or the like.

Adhesion layer 141 is a layer at least containing a light curing resin composition and it is cured by irradiation of a liquid light curing adhesive with light having a prescribed wavelength. This adhesion layer 141 has its entirety sufficiently cured, and it is secured to front surface 120*a* of light-transmitting layer 120 and a back surface 130*b* of reflector 130. For example, an ultraviolet curing adhesive cured by irradiation with ultraviolet rays, a visible light curing adhesive cured by irradiation with visible light, or the like is suitably made use of as the light curing adhesive, and more specifically, acrylic-resin-based and epoxy-resin-based light curing adhesives and the like are made use of. A thickness of adhesion layer 141 is not greater than 0.5 mm, which is at least a curing depth of the light curing adhesive, and more suitably not smaller than 10 µm and not greater than 100 µm.

Figure 20:
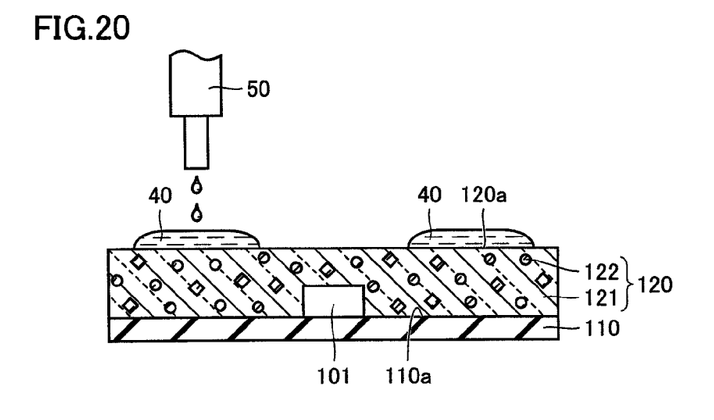
FIG. 20 is a diagram for illustrating a method of manufacturing an optical module in the fourth embodiment of the present invention.
Figure 21:
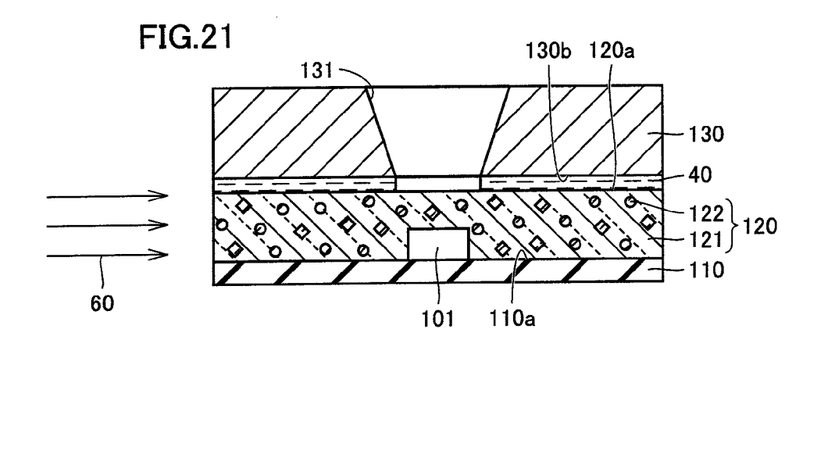
FIG. 21 is a diagram for illustrating the method of manufacturing an optical module in the fourth embodiment of the present invention.

FIGS. 20 and 21 are diagrams for illustrating a method of manufacturing an optical module in the present embodiment. The method of manufacturing an optical module in the present embodiment for realizing the structure of the optical module in the present embodiment described above will now be described with reference to these FIGS. 20 and 21. It is noted that the adhesion method in the second embodiment of the present invention described above is applied to the method of manufacturing the optical module in the present embodiment described below.

Initially, as shown in FIG. 20, LED chip 101 is mounted on front surface 110*a* of interposer 110 which is the adhesion object. Here, the die bond material described above is made use of for mounting LED chip 101 on interposer 110.

Then, front surface 110*a* of interposer 110 on which LED chip 101 is mounted is sealed with light-transmitting layer 120 containing light-transmitting composition 121 as the base material, in which light-transmitting filler 122 is contained in a dispersed manner. For forming light-transmitting layer 120, for example, transfer molding is made use of. Thus, LED chip 101 is completely covered with light-transmitting layer 120.

Then, liquid light curing adhesive 40 is applied onto front surface 120*a* of light-transmitting layer 120, for example, by using a dispenser. Here, light curing adhesive 40 is applied such that it is not applied onto light-transmitting layer 120 in a portion corresponding to a portion where LED chip 101 is located, by avoiding application thereof onto that portion. It is noted that an amount of application of light curing adhesive 40 is set to an amount sufficient for adhesion layer 141 after curing to have a prescribed thickness.

Then, as shown in FIG. 21, reflector 130 is stacked on front surface 120*a* of light-transmitting layer 120 to which light curing adhesive 40 has been applied, such that front surface 120*a* of light-transmitting layer 120 and back surface 130*b* of reflector 130 are opposed to each other. Here, according to one or more embodiments of the present invention, a state that back surface 130*b* of reflector 130 and front surface 120*a* of light-transmitting layer 120 are spaced apart from each other by a prescribed distance is maintained, with a gap between these reflector 130 and light-transmitting layer 120 being filled with liquid light curing adhesive 40.

Then, while maintaining the state above, light having a prescribed wavelength for curing the light curing adhesive is emitted laterally from the side of light-transmitting layer 120 toward light-transmitting layer 120 (in the drawing, a direction of light irradiation is shown with arrow 60).

Here, light-transmitting layer 120 forms a course of light for curing light curing adhesive 40, and light spreads over light curing adhesive 40 through this light-transmitting layer 120. Specifically, the light above introduced in light-transmitting layer 120 is mainly refracted at an interface between light-transmitting composition 121 and light-transmitting filler 122 based on a difference between an index of refraction of light-transmitting composition 121 and an index of refraction of light-transmitting filler 122 and partially reflected at the interface between light-transmitting composition 121 and light-transmitting filler 122. Thus, owing to the interface reflection action, the interface refraction action and the internal scattering action of light-transmitting layer 120 on the light, the light scatters in light-transmitting layer 120 and thus the light efficiently reaches the light curing adhesive at a greater depth from the side surface. Here, since the layer of light curing adhesive 40 has a thickness smaller than the curing depth of light curing adhesive 40 as described above, the light scattered in light-transmitting layer 120 and having reached light curing adhesive 40 promotes curing reaction in the entire region in the layer of light curing adhesive 40 and light curing adhesive 40 is cured in its entirety. Thus, adhesion layer 141 interposed between light-transmitting layer 120 and reflector 130 firmly adheres these light-transmitting layer 120 and reflector 130 to each other and adhesion and fixation between interposer 110 and reflector 130 that are the adhesion objects is realized, so that optical module 100 having the construction as in FIG. 19 described above is obtained.

By realizing the structure of optical module 100 as in the present embodiment described above by using the method of manufacturing the optical module as in the present embodiment described above, reflector 130 and interposer 110 that are the light-blocking members can be adhered to each other by using light curing adhesive 40 with sufficient adhesion strength. In addition, the adhesion operation itself remains the same as the conventional adhesion operation in which light curing adhesive 40 is applied to the adhesion object which is in turn irradiated with light, and hence the operation ends very easily in a short period of time. Therefore, by adopting the optical module and the method of manufacturing the same as in the present embodiment, the optical module in which the reflector serving as the light guide path forming member is adhered with sufficient adhesion strength can easily and quickly be manufactured.

In the present embodiment, an optical module containing an LED chip which is a light projection device has been described by way of example of an optical semiconductor device, however, one or more embodiments of the present invention is also applicable to an optical module containing a PD chip which is a light reception device, instead of an LED chip. In addition, though one or more embodiments of the present invention is suitably made use of for an optical module, the application thereof is not limited to the optical module and it is also naturally applicable to a semiconductor module on which other electronic components are mounted. Moreover, an application of one or more embodiments of the present invention is not limited to a semiconductor module alone, and one or more embodiments of the present invention is applicable to various optical parts, other mechanical parts and the like.

In each embodiment of the present invention described above, a case where a light curing adhesive is applied only to an adhesion surface of one adhesion object has been described by way of example, however, the light curing adhesive may naturally be applied only to an adhesion surface of the other adhesion object or it may be applied to adhesion surfaces of both of one and the other adhesion objects.

Further, in each embodiment of the present invention described above, a case where all regions in a pair of opposing surfaces of adhesion objects to be adhered by a light curing adhesive (that is, adhesion surfaces) are adhered by the light curing adhesive has been described by way of example, however, all regions in the opposing surfaces do not necessarily have to be adhered and only a partial region thereof may be adhered so long as sufficient adhesion strength is ensured.

Furthermore, in the second to fourth embodiments of the present invention described above, a case where a light-transmitting member containing a light-transmitting filler in a dispersed manner is interposed between adhesion objects has been described by way of example, however, a reflective filler capable of reflecting light at its surface may also be made use of as a filler to be contained in the light-transmitting member. Here, for example, a light-blocking metal filler or the like that does not allow passage of light can be made use of as the reflective filler.

In addition, in the fourth embodiment of the present invention described above, a case where a reflector is adopted as a light guide path forming member which is the second light-blocking member to be adhered to an interposer serving as the base member, which is the first light-blocking member, with a light-transmitting member being interposed, has been described by way of example, however, for example, a fiber guide or the like for connecting an optical fiber to an optical module may be employed as the light guide path forming member.

Moreover, characteristic features shown in each embodiment of the present invention described above can be combined with each other.

Thus, each embodiment disclosed herein above is illustrative and non-restrictive in every respect. The technical scope of the present invention is defined by the terms of the claims, and includes any modifications within the scope and meaning equivalent to the terms of the claims. While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE SIGNS 10 first light-blocking member; 10a front surface; 20 light-transmitting layer; 20a front surface; 20b back surface; 21 light-transmitting composition; 22 light-transmitting filler; 30 second light-blocking member; 30b back surface; 40 light curing adhesive; 41, 42 adhesion layer; 50 dispenser; 100 optical module; 101 LED chip; 110 interposer; 110a front surface; 120 light-transmitting layer; 120a front surface; 121 light-transmitting composition; 122 light-transmitting filler; 130 reflector; 130b back surface; 131 opening; and 141 adhesion layer.

The invention claimed is:

1. An adhesion structure, comprising:
a light-transmitting member allowing passage of light having a prescribed wavelength;
a first light-blocking member located on a side of a back surface of said light-transmitting member and allowing substantially no passage of light having said prescribed wavelength;
a second light-blocking member located on a side of a front surface of said light-transmitting member and allowing substantially no passage of light having said prescribed wavelength; and
an adhesion layer located between at least any one of said first light-blocking member and said second light-blocking member and said light-transmitting member, for adhering said light-blocking member and said light-transmitting member to each other,
wherein said adhesion layer contains a light curing resin composition cured by irradiation with light having said prescribed wavelength, and
wherein said first light-blocking member and said second light-blocking member are integrated with each other, with said light-transmitting member being interposed.

2. The adhesion structure according to claim 1, wherein said light-transmitting member contains a light-transmitting composition serving as a base material and a filler contained in a manner dispersed in said light-transmitting composition in order to scatter light emitted toward said light-transmitting member in said light-transmitting member.

3. The adhesion structure according to claim 2, wherein said filler comprises a reflective filler for reflecting light having said prescribed wavelength at a surface thereof.

4. The adhesion structure according to claim 2, wherein said filler comprises a light-transmitting filler different in index of refraction from said light-transmitting composition, for refracting light having said prescribed wavelength at a surface thereof.

5. The adhesion structure according to claim 4, wherein a ratio of a total weight of said light-transmitting filler to a total weight of said light-transmitting member is 10% or higher.

6. An optical module, comprising:
a light-transmitting member allowing passage of light having a prescribed wavelength;
a base member located on a side of a back surface of said light-transmitting member;
an optical semiconductor device mounted on a front surface of said base member and sealed with said light-transmitting member;
a light guide path forming member located on a side of a front surface of said light-transmitting member; and
an adhesion layer for adhering said light-transmitting member and said light guide path forming member to each other, and
wherein said adhesion layer contains a light curing resin composition cured by irradiation with light having said prescribed wavelength.

7. The optical module according to claim 6, wherein said light-transmitting member contains a light-transmitting composition serving as a base material and a filler contained in a manner dispersed in said light-transmitting composition in order to scatter light emitted toward said light-transmitting member in said light-transmitting member.

8. The optical module according to claim 7, wherein said filler comprises a reflective filler for reflecting light having said prescribed wavelength at a surface thereof.

9. The optical module according to claim 7, wherein said filler comprises a light-transmitting filler different in index of refraction from said light-transmitting composition, for refracting light having said prescribed wavelength at a surface thereof.

10. The optical module according to claim 9, wherein a ratio of a total weight of said light-transmitting filler to a total weight of said light-transmitting member is 10% or higher.

* * * * *